United States Patent [19]

Ackermann et al.

[11] Patent Number: 5,260,863

[45] Date of Patent: Nov. 9, 1993

[54] CONTROL OF A DISCONTINUOUS CURRENT BY A THYRISTOR RECTIFIER WITH INDUCTIVE LOAD

[75] Inventors: Bernd L. Ackermann; Peter L. Herkel, both of Berlin, Fed. Rep. of Germany

[73] Assignee: Otis Elevator Company, Farmington, Conn.

[21] Appl. No.: 812,866

[22] Filed: Dec. 20, 1991

Related U.S. Application Data

[63] Continuation of Ser. No. 589,860, Sep. 28, 1990, abandoned.

[51] Int. Cl.$^5$ .......................................... H02M 5/443
[52] U.S. Cl. ........................................ 363/88; 363/57; 363/85; 363/139
[58] Field of Search .................. 363/88, 85, 139, 57, 363/96, 135, 136

[56] References Cited

U.S. PATENT DOCUMENTS 3,365,649  1/1968  Shaw .................................. 363/88
4,891,741  1/1990  Slattery .............................. 363/35

Primary Examiner—Emanuel T. Voeltz
Assistant Examiner—Adolf Berhane

[57] ABSTRACT

For controlling the current in an inductive load, the gate current used to fire thyristors in a rectifier is controlled to reach zero at exactly the same time, within a given half-wave, as the current in the inductive load which receives the voltage from the rectifier, keeping gate voltage on as long as thyristor current is on. A discontinuous thyristor converter current signal is detected and used to generate an enable signal in conjunction with a thyristor gate voltage. The enable signal, in synchronism with a power supply line voltage, provides a pair of channeling signals which then, depending upon whether the field current is positive or negative, activate the gate voltages of the thyristors such that the gate voltages end exactly at that time, within a given half-wave, where the generator field current becomes discontinuous.

5 Claims, 7 Drawing Sheets

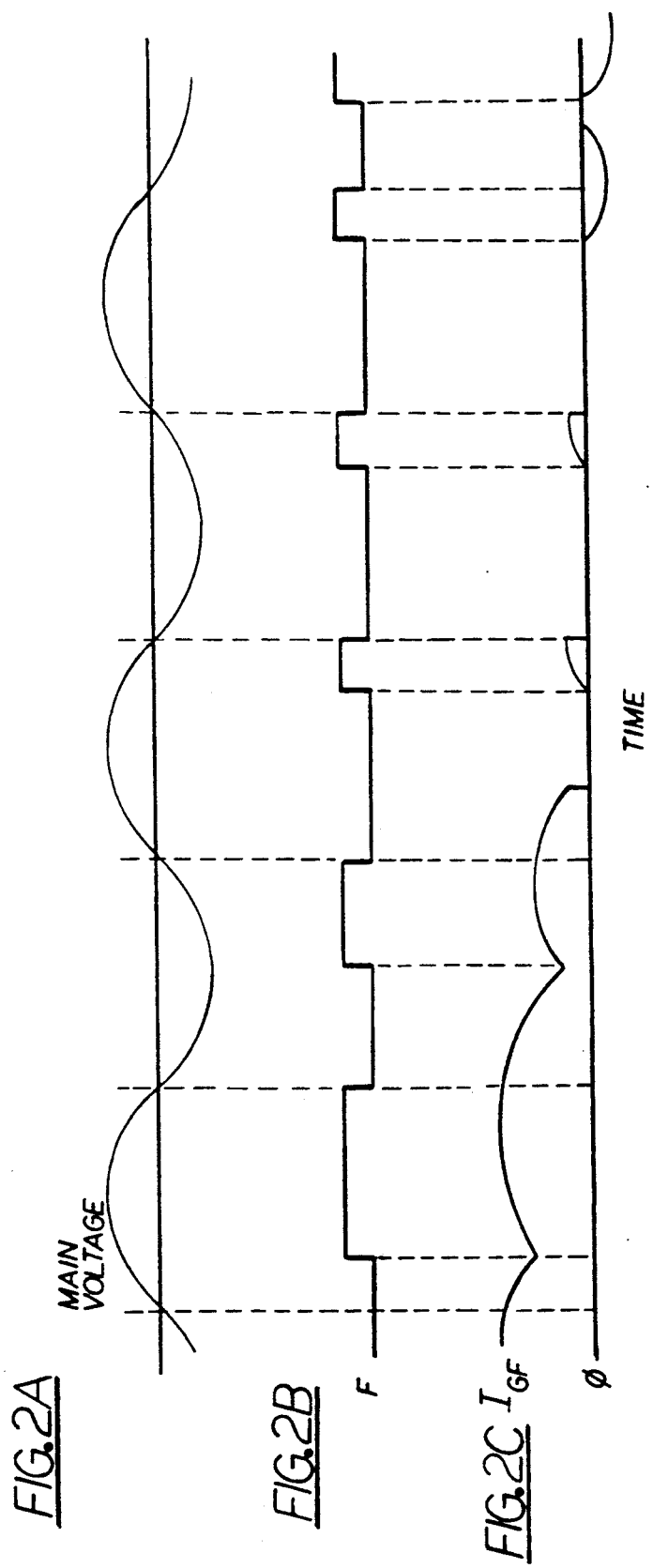

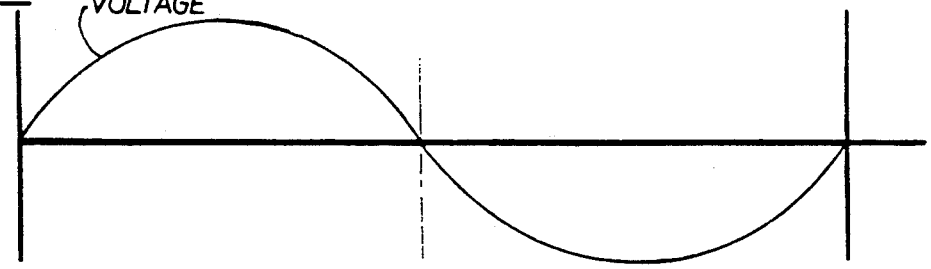
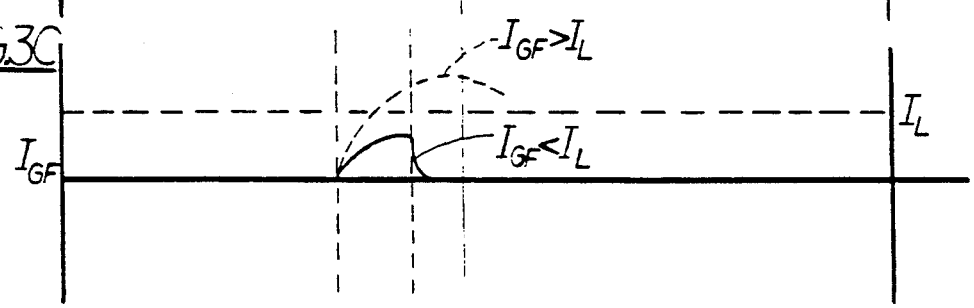
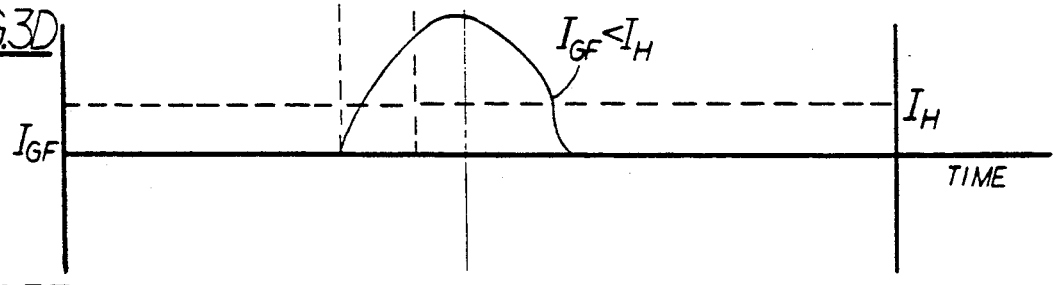

CONTROL OF A DISCONTINUOUS CURRENT BY A THYRISTOR RECTIFIER WITH INDUCTIVE LOAD

This is a continuation of co-pending application, Ser. No. 07/589,860 filed on Sep. 28, 1990, now abandoned.

TECHNICAL FIELD

This invention relates to control of the output current of a thyristor rectifier having an inductive load where that current becomes discontinuous.

BACKGROUND OF THE INVENTION

The speed of a Ward Leonard DC drive is controlled by a generator field current Igf. Therefore, the performance of speed control depends on the quality of field current Igf control. To achieve slow speed, the generator field current Igf has to be controlled at a very low level, and during deceleration and a consequent reversal, the field current Igf has to cross zero and change its sign repsectively.

A controlled rectifier using thyristors is a cost effective type of regulating unit for the generator field current Igf control. FIG. 1 shows a typical thyristor configuration, a two-way power converter, as a generator field power converter 5 in a cascade drive control scheme. A velocity controller 2 compares actual velocity with a dictated velocity and sets an appropriate torque command T which is the reference input for an armature current control loop 3. An armature current regulator 4 calculates a firing angle F which activates the SCR converter 5 to set the output voltage Vgf of a generator field winding 7 of a generator 8 of an MG-set 9, thus providing a current Iscr through a generator field winding 7. The SCR converter 5 is connected to a power transformer secondary winding 10, part of a typical sinusoidal voltage source (not shown), for receiving a power signal. A DC hoist motor 11 will be activated by the generator armature current to produce a torque proportional to the armature current Ia, thereby moving a counterweight 12 and a car 13 through rotation of a sheave 14. Actual velocity is fed back to be summed with the dictated velocity by means of a tachometer 15. A digital synchronization signal 9 is generated by 16, in phase with the line voltage, across the power transformer secondary winding 10.

The converter 5 is a two-way power converter consisting of two center tap-connected pairs of thyristors (T1,T3) and (T2,T4) in anti-parallel connection. The thyristors (T3) and (T4) are fired to achieve a generator field current Igf in the positive direction, causing a motor torque for the elevator traveling in the up direction, while (T1) and (T2) are fired to achieve current in the other direction, causing a motor torque while the elevator is traveling in the down direction. The thyristors for the positive half-wave of the line voltage are (T2,T3), and the thyristors for the negative half-wave of the line voltage are (T1,T4). The gates 17 of the SCRs 18 are connected to the current regulator 4 which controls the conduction state of each SCR 18. The SCRs 18 are driven by pairs into conduction at various times during the cycle of the AC energy from AC source feeding the power transformer, and a resultant DC output voltage is produced.

A generator field current Igf can be achieved by firing the thyristors at a fixed firing angle F (FIG. 2). The thyristors are fired by switching on the thyristor gate current at an instant corresponding to the firing angle. The gate current can have the shape of either a short pulse or a long pulse, either: (i) a slim pulse or (ii) a square wave ending at the next zero crossing of the AC voltage or even lasting until the next thyristor is fired in the following half-wave.

If the load is resistive, Igf becomes zero after the end of the half-wave of the mains voltage and stays zero until another thyristor is fired in the next half-wave. With an inductive load, however, the load forces Igf to continue flowing through the same thyristor and transformer winding 10 even in the next half-wave where it then flows in a direction opposite the mains voltage until another thyristor is fired in that half-wave.

In case of firing angles in the range of 90 to 180 degrees electric, the generator field current Igf becomes discontinuous if the average value Igf is lower than a certain limit. Discontinuity means that the Igf is zero within a certain period of time during each half-wave of the mains ac voltage. Discontinuity is caused by the interaction of two effects. The first is the ripple of the field current which depends on the shape of the field voltage and the values of the field inductivity and resistance. The second is the special behavior of the thyristors to switch off currents below a holding current or latching current.

When operating the thyristor rectifier with an inductive load a discontinuous current, the conventional firing method explained above would be disadvantageous for the following two reasons.

Period of Gate Current Too Short: Negative Effects of Latching and Holding Currents There are two thyristor forward on-state current margins, "Latching Current" $I_L$ and "Holding Current", $I_H$ that determine the thyristor performance at discontinuous current.

An SCR requires a certain minimum anode current to maintain it in the closed, or conducting, state. If, while the gate current is zero, the anode current drops below this minimum level designated as the holding current, the SCR reverts to the forward blocking, or open state.

A somewhat higher value of anode current than the holding current is required for the SCR to initially pick up. If this higher value of anode latching current is not reached, the SCR will revert to the blocking state as soon as the gate signal is removed. After this initial pickup action, however, the anode may be reduced to the holding current level.

For the SCR to trigger, the anode current must be allowed to build up rapidly enough so that the latching current $I_L$ is reached before the triggering pulse is terminated. For highly inductive anode circuits, one must use a maintained trigger which assures gate drive until latching current $I_L$ has been attained. FIG. 2a shows the line voltage. FIG. 2b shows the thyristor gate current F. FIG. 2c shows the $I_L$, $I_H$ the resulting generator field current Igf. With a high firing angle, the generator field current Igf becomes discontinuous. Increases in firing angle bring increases in the time of current discontinuity.

the thyristor current F does not reach the "Latching Current $I_L$" before the gate current ends, the thyristor switches off at the end of the gate current (FIG. 3C). If the thyristor current falls below the "Holding Current" after the gate current $I_H$ has ended, the thyristor switches off at once (FIG. 3D).

The thyristor forward on-state current is equal to the field current Igf. So, if the field current Igf remains or falls below one of these margins, it is switched off by the thyristor. As this effect can vary from period to period due to the parameters mentioned above, no stable status can be achieved. This is the first reason the conventional firing method is disadvantageous. In a closed loop control system, this effect, when coupled with the effects of control loop time constants, results in oscillations of the generator field current Igf and therefore the drive movement as well. FIG. 3A shows the line, FIG. 3B shows the gate voltage waveform and FIGS. 3C and 3D show the effects upon generator field current Igf where the gate period is too short. In FIG. 3C, the generator field current Igf begins to climb with the application of the gate current F and will be maintained if the thyristor current achieves the latching current $I_L$ before the gate voltage is taken away. However, the latching current $I_L$ is not achieved before the gate current F is gone and the generator field current Igf begins to decay back to zero (FIG. 3C). FIG. 3D shows the generator field current Igf turning off suddenly when it drops below the holding current $I_H$.

Period of Gate Current Too Long: Negative Effects of Inverse Currents

The second reason the above firing method is disadvantageous is that if the gate current F continues flowing even after the thyristor current has become zero and the thyristor is stressed by a reverse off-state voltage, a considerable reverse thyristor current will flow, causing heat losses. Furthermore, if the thyristor is fired late enough within the half-wave, the average reverse current will be bigger than the forward current, resulting in an average negative generator field current (FIG. 3F).

This effect is especially troublesome when the field current Igf is reversed by switching the control over to the second part of the rectifier, being a part of the two-way converter, which is connected with inverse polarity. In this case, the field current Igf would be increased in the previous direction again to an average value determined by the reverse current of the thyristors of that second part of the rectifier. This results in a torque transient and causes vibrations in the drive.

FIGS. 3E and 3F show the generator field current Igf when the gate signal is too long and continues to flow far into the negative half-wave after the positive thyristor current has long since ended. The result is inverse generator field current.

DISCLOSURE OF THE INVENTION

According to the present invention, for controlling a current provided by a rectifier to an inductive load, a gate current used to fire thyristors in the rectifier is controlled to reach zero at exactly the same time, within a given half-wave, as the current in the inductive load thereby keeping gate current on only so long as thyristor current is on. A discontinuous thyristor converter current signal is detected and, along with a thyristor gate signal, used to generate an enable signal in conjunction with a thyristor gate current. The enable signal, in synchronism with a power supply line voltage and the thyristor gate signal provides a pair of channeling signals which then, depending upon whether the field current is positive or negative, activates the gate currents of the thyristors such that the gate currents end exactly at that time, within a given half-wave, where the generator field current becomes discontinuous. The invention thus leads to a more ideal thyristor behavior in the region of small anode currents because the thyristors are enabled to carry small currents all the way down to zero without the thyristors switching off sooner than the time at which thyristor current is zero.

The problem and solution are stated differently. The firing angle ends the end of the previous half-wave. If the gate turns off before the thyristor has achieved its latching current, the thyristor will shut off so that no generator field current is produced which further causes negative effects on the drive. Negative effects occur if the thyristor shuts off its own forward current in case the gate current ends before the forward current reaches the latching current or decreases below the holding current before the forward current is zero. When the average load current decreases and this effect of shutting off the forward current occurs the first time, this will cause a step in the average generator field current. The result will be a jerk in the drive. The solution is to lengthen the gate duty cycle. On the other hand, if the generator field current decreases below holding current and there is no gate current, then the thyristor shuts off suddenly, resulting in negative drive effects. The solution, to this first problem is to continue gate current until thyristor current is zero, such that there is no sudden dropping off of thyristor current.

Second, a different problem, when the thyristor current is zero, the gate current must be turned off. When there is a gate current and a negative voltage across the thyristor, so that the thyristor will not be fired, there will be an undesirable reverse current through the thyristor. The solution is to have gate current on only when thyristor current is flowing.

In sum, it must be ensured that the gate on current is long enough to avoid the effects of latching and holding current, but short enough to avoid heat losses, or, should a reverse voltage be applied to the thyristor, a reverse current in the power converter. The problem is the jump in current when changing from the one power converter to the inverse connected one, in this two-way converter, in order to change field current direction. This should happen at zero current due to the largest possible firing angle at that event. This large firing angle, however, leads to a large average reverse current and the current jump will be as high as the sum of the reverse currents of each of the two one-way power converters that make up the two-way power converter. The gate current is enlarged into the negative half-wave so that the gate current zeroes with the thyristor current and the gate current is cut off when thyristor current zeros.

Thus, the gate current must be enlarged into the negative half-wave and cannot be turned off at the end of the positive half-wave.

It is an object of the present invention to detect the discontinuity in the output current of a thyristor configuration.

It is a further object of the present invention to eliminate thyristor rectifier output current oscillations or jumps due to the thyristor latching and holding current levels.

It is a further object of the present invention to eliminate heat losses caused by a thyristor rectifier being stressed by a reverse voltage while reverse thyristor current is flowing.

It is a further object of the present invention to eliminate an average negative generator field current coming from a thyristor rectifier in a Ward-Leonard electric drive when a large firing angle should lead to a small positive current.

It is a further object of the present invention to eliminate torque transients and vibration in an elevator drive.

These and other objects, features and advantages of the invention will become more apparent in the light of the following description of an exemplary embodiment of the invention as shown in the accompanying drawing.

BRIEF DESCRIPTION OF THE DRAWING

FIG. 2 is a timing diagram of the input and output signals found in a prior art system.

FIG. 3A-F is a timing diagram of thyristor holding and latching currents, determined by the pulse width of the gating current and, determining generator field current.

BEST MODE EMBODIMENT OF THE INVENTION

The solution of the problem is described by means of an example of a generator field current control of a Ward Leonard drive in an elevator, but, in principle, it can be applied in each case where a discontinuous dc current through an inductive load is controlled by a thyristor rectifier.

Figure 4:
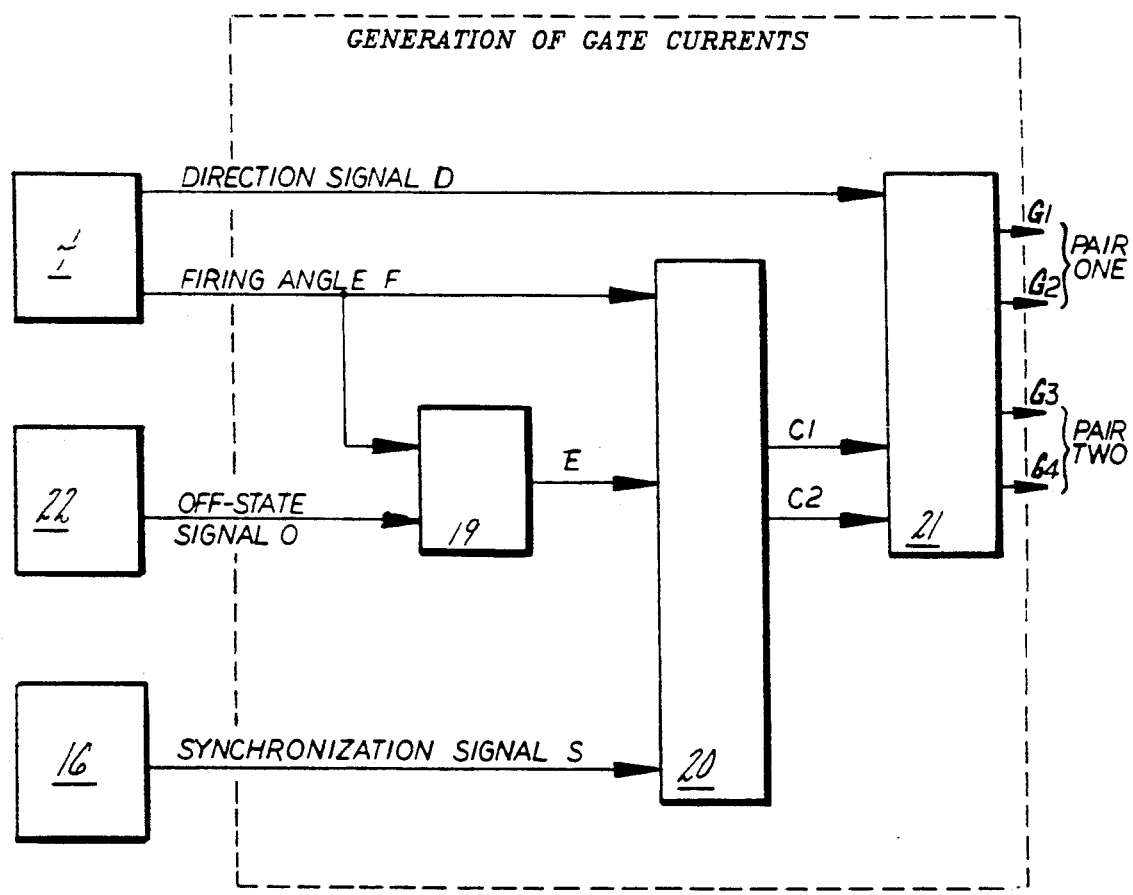
FIG. 4 is a block diagram of the apparatus of the present invention.
Figure 5:
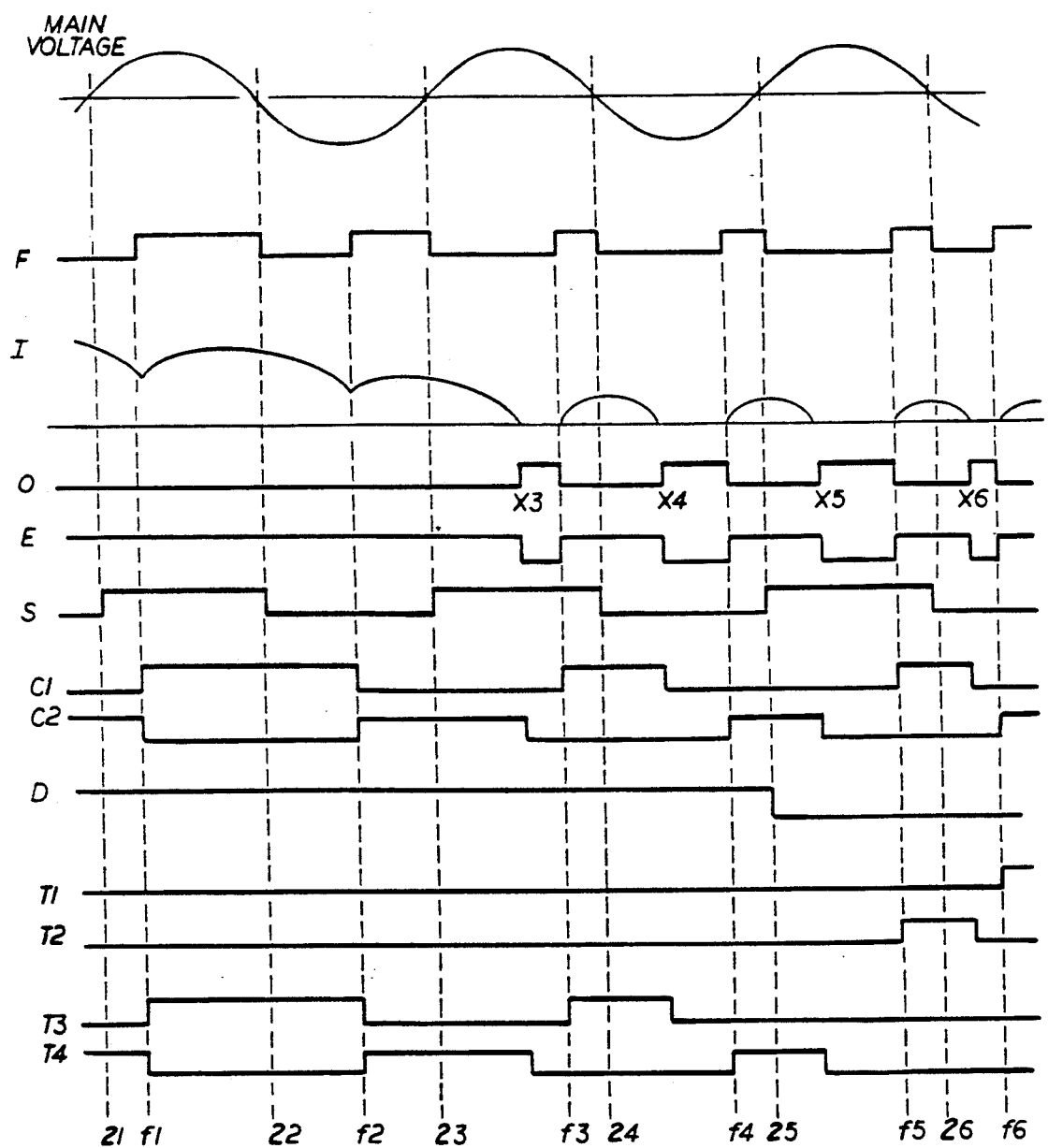
FIG. 5 is a drawing of timing signals used in the apparatus of the present invention to cause thyristor gate current to shut off when the generator field current reaches zero.

FIG. 4 shows the scheme of the generation of the thyristor firing current according to this invention. This process is divided into a firing command enable subprocess 19, a channeling subprocess 20, and a gating subprocess 21. FIG. 5 indicates the timing signals used and provided by each of these subprocesses.

Figure 1:
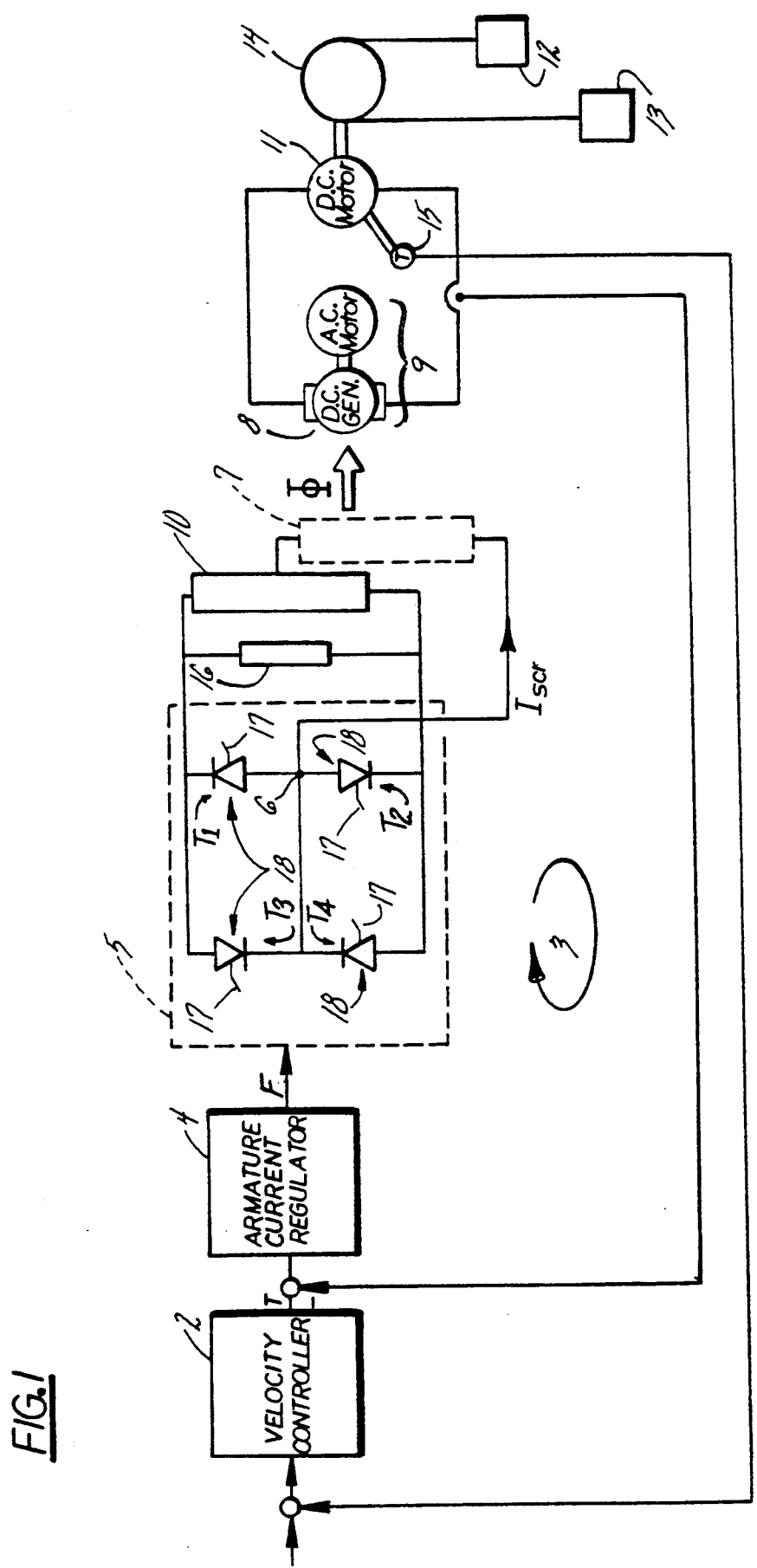
FIG. 1 is a block diagram of a Ward-Leonard electric drive employing a thyristor configuration to excite a generator field winding.

As input signals to the process, the current regulator 4 delivers a current direction signal D and the SCR gate firing angle command F, the Off-State Monitor 22 delivers the Off-state signal O, and the Mains Monitor 16 delivers the synchronization signal S, a square wave which is logic low in the negative half-wave and logic high in the positive half-wave. The state of the synchronization signal S changes at the zero crossings of the mains voltage. As outputs of the process, there are the four firing signals (G1,G2,G3,G4) for firing the four thyristors of FIG. 1. The direction signal D comes from the current regulator.

Corresponding to the firing angles at times f1 to f6 of the regulator 7 a current Igf in the generator field flows. The current becomes temporarily discontinuous at times x3 to x6.

Figure 6:
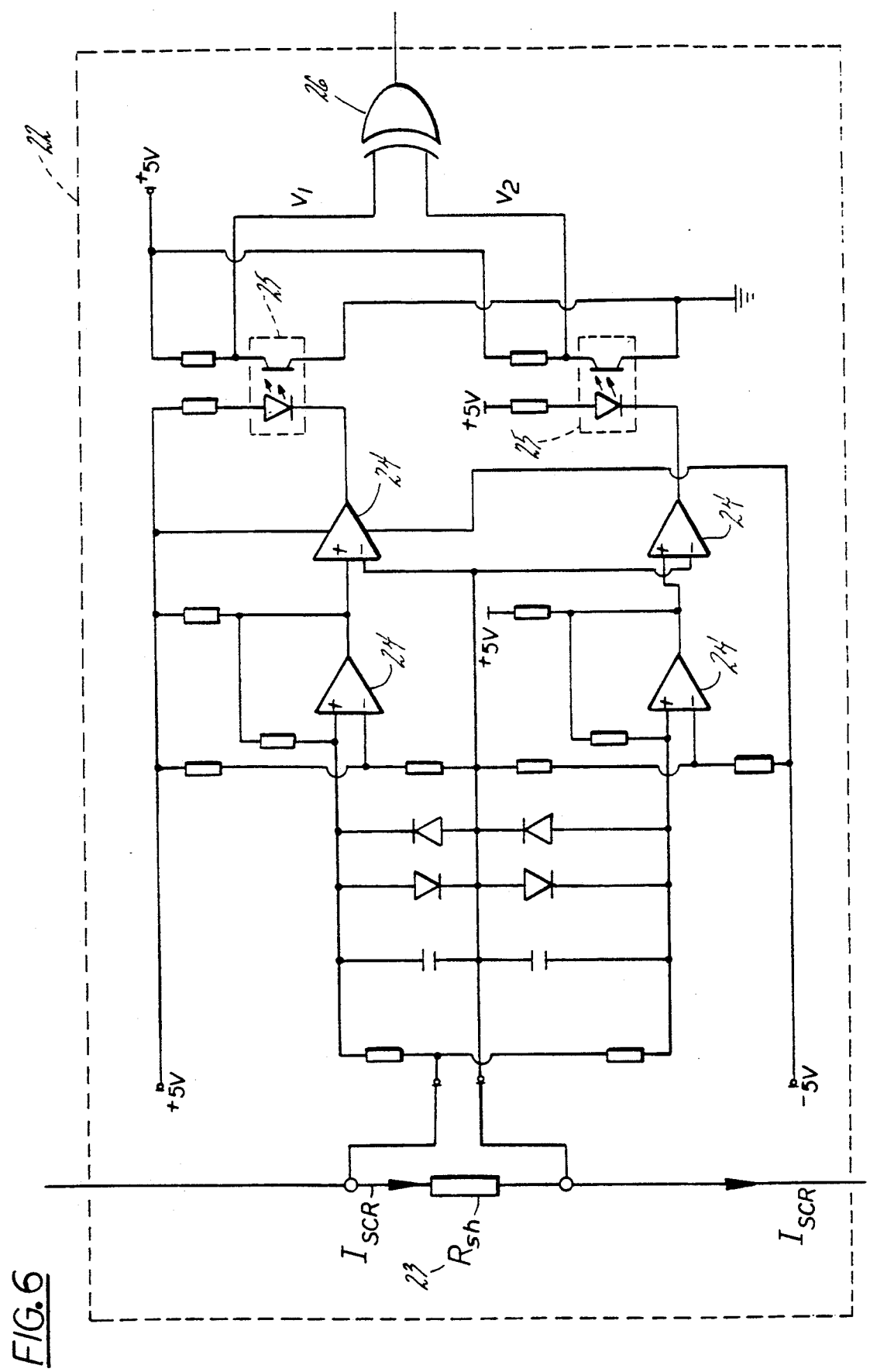
FIG. 6 is a schematic diagram of the off-state monitor used in the present invention.

The Off-State Monitor 22 (FIGS. 4 and 6) detects the discontinuity in the generator field current Igf and delivers the corresponding off-state signal O (FIG. 5). A shunt resistor 23 receives the current provided by the thyristor rectifier 6. The voltage of the shunt resistor is measured by the Off-State Monitor 22, giving the generator field current Igf. The output signal O of the off-state monitor 22 is on logic level low if field current Igf is flowing, while it is on logic level high while the current Igf is zero. This signal is sent to a logic circuit 19 that has the task of shaping the thyristor firing current.

The on/off ratio, or duty cycle, of Iscr indicates the time duration of discontinuous current. The off-state monitor works as follows: The SCR converter current is measured by the shunt resistor Rsh 23 (FIG. 6). and the Iscr off-state is detected by four comparators 24 that change their output states depending on the shunt resistor voltage. Two logic signals V1 and V2 are sent to optically coupled isolators 25. While Iscr is flowing, V1 and V2 are equal. When Iscr is not flowing, during Iscr discontinuity, V1 and V2, are not equal. V1 and V2 are the provided to a logical XOR 26, the output signal of which has the shape of a pulse width modulated signal. The XOR output signal O is logic level high if Iscr is not flowing and logic level low if Iscr is flowing.

A firing command enable subprocess 19 is responsive to the firing angle command F, and the off-state signal O and provides a firing command enable E (FIG. 5). The firing command enable determines the time at which the gate current of any thyristor is allowed to flow. The firing angle command F then sets the firing command enable E independently of the off-state signal O to start the firing of the thyristors. If thyristor firing was only allowed while the field current is flowing, one would not be able at all to fire a thyristor at discontinuous current. So the enable signal E has to be set even if signal O is high, which is always the case for discontinuous current. Therefore, signal E is forced to logic high for the time period, during which the signal F is high (reset input of D flip-flop 27, FIG. 7) thus blocking the off-state monitor effect. Signal F becomes zero close to the end of each half-wave of the mains voltage, but current discontinuity can earliest appear at the beginning of the next half-wave.

Figure 7:
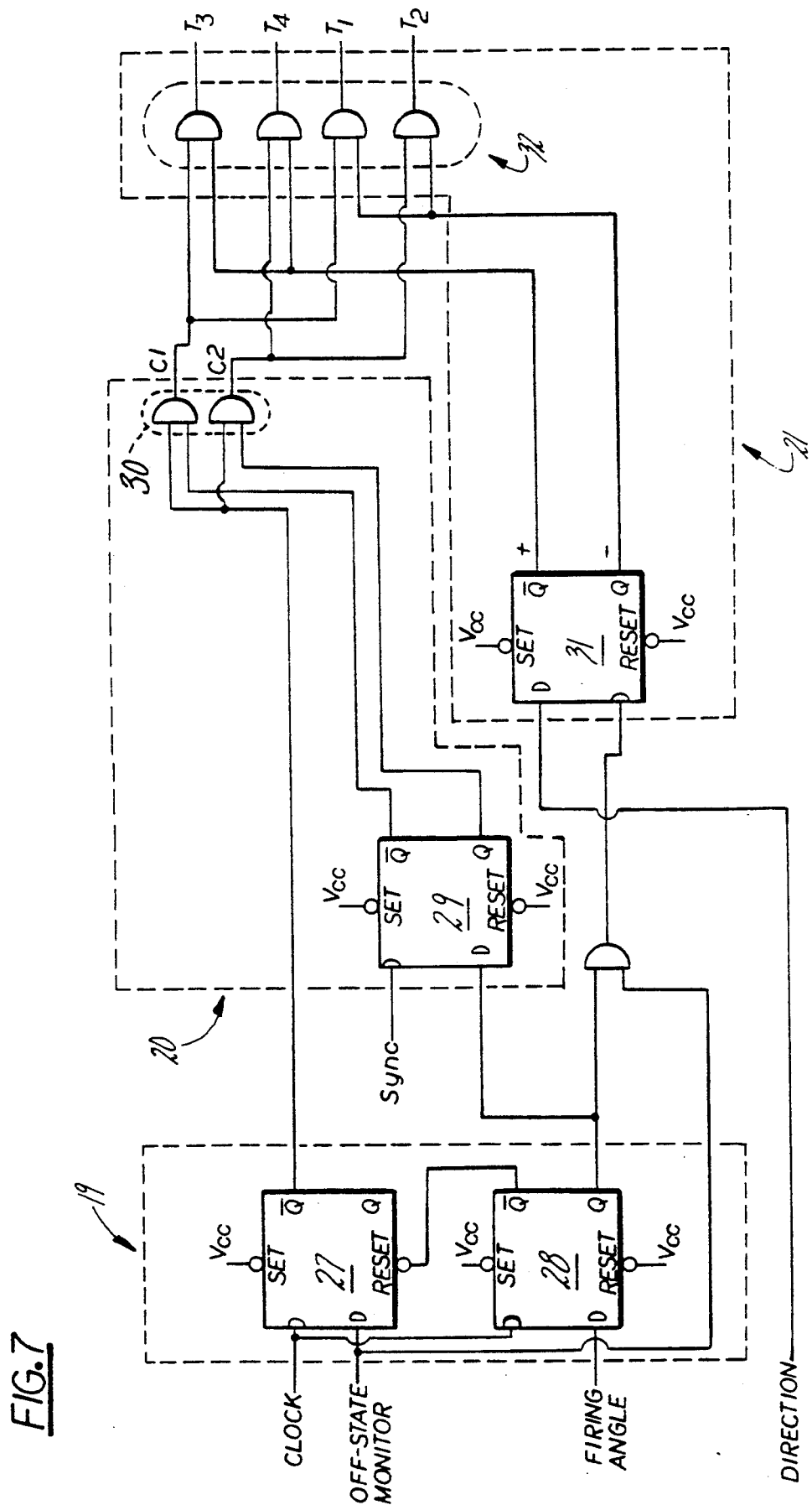
FIG. 7 is a detailed schematic diagram of portions of the block diagram of FIG. 4.

The off-state signal O cuts off the firing command enable E as soon as the current in the generator field becomes zero so as to terminate the firing of the thyristors (FIG. 5). The firing command enable subprocess may be performed using two D flip-flops 27, 28 (FIG. 7). The off-state monitor output O is fed to a first flip-flop 27 and passed when the clock input is high. A second flip-flop 28 passes the firing angle command signal when the clock input is high. The complement output of flip-flop 28 resets the first flip-flop 27. The complement output of the first flip-flop is the firing enable command E (FIGS. 5, 7).

The remaining steps in the process of this invention are needed to determine which thyristor to fire.

Subprocess 20 is responsive to the firing command enable E, the firing angle command F, and the synchronization signal S to form the two firing command channeling signals C1, C2 (FIGS. 4, 5, 7). The firing command channeling signals C1, C2 determine which of the thyristors has to be fired with the new firing angle in the positive half-wave and which must be fired in the negative half-wave according to the mains voltage, FIG. 5. The firing command channeling subprocess 20 may be carried out by means of flip-flops and logical AND gates (FIG. 7). A third D flip-flop 29 is responsive to the synchronization signal S and the output of the flip-flop 28. The normal and complement outputs of the flip-flop 29 are provided to a pair of AND gates 30. An inverter could be substituted for the third D flip-flop 29, but the preferred embodiment uses a flip-flop 29 because it synchronizes the channeling signals C1, C3 with the mains voltage and eliminates propagation delays.

Finally, gating subprocess 21 is responsive to the firing command channeling signals C1,C2 and the direction signal D to form the four firing signals (G1,G2,G3,G4), one for each of the SCRS, T1, T2, T3 and T4, respectively. Direction signal D is logic high for positive generator field current and low for negative generator field current. The generator current is generally positive for positive direction of the elevator and vice versa, but it must change direction at the end of a deceleration (generating) phase, causing negative generator armature voltage and thus allowing the armature current to be maintained even at a low speed, when the motor armature voltage decreases to zero. The firing signals (G3,G4) will achieve a field current in the positive direction, whereas the signals (G1,G2) will achieve one in the negative direction. Thyristors T1 and T2 are not conducting at any time while D is high; thyristors T3 and T4 are conductive while D is low. When the direction of the generator field current is to be changed, the direction signal will toggle. To avoid a short circuit in the thyristor rectifier, the thyristor for the new current direction will be fired only after the current in the first direction becomes zero, as indicated by the off-state signal O on logic high level. FIG. 5 shows that any thyristor will be fired as long as current is flowing through it. In the case of discontinuous current the firing signal for one thyristor is cut off when the field current becomes zero. On the other hand, in the case of continuous current the firing signal is cut off when the next thyristor is to be fired. When the direction signal D changes (z5, FIG. 5) while one of the thyristors is on (in this case T4), the gate current must not be switched over to T1 (which is the respective thyristor for the other current direction) as long as T4 is on; T4 does not switch off by itself as long as its holding current remains exceeded. Otherwise, T1 and T4 would be on at the same time and would cause a short circuit of the transformer 10. So switching over of the gate current is only allowed during the off state of all thyristors which means zero generator field current detected by the off state monitor 22. T1 is not fired directly after time z5 although D changes to zero. The next thyristor to be fired after time x5 is T2.

A fourth D flip-flop 31 and four AND gates 32 are used for this purpose, the particular hardware used here being readily understood by those skilled in the art to be unimportant, and, of course, the invention could be implemented in software.

The firing angle signal F, obtained from the current regulator, and the off-state monitor output O are fed into the firing command enable subprocess 19. The firing command enable subprocess 19 provides that as long as there is current flowing in one of the thyristors, that is to say, while O is low, the firing enable signal is kept high. The firing enable signal goes high when a firing angle command F first issues from the regulator. E is kept after F has been triggered and will be turned off when the current in one of the thyristors goes to zero. The firing and enable signal will again be set high the next time a firing angle command is issued from the current regulator. It will again turn off when the gate current goes zero. The firing enable signal E does not command the firing of the thyristors but only commands that some thyristor should be fired. Here, the firing angle is clocked into a D flip-flop 28 while the off-state monitor signal O is clocked into a D flip-flop 27.

Although the invention has been shown and described with respect to an exemplary embodiment thereof, it should be understood by those skilled in the art that various changes, omissions and additions in the form and detail thereof may be made therein and thereto without departing from the spirit and the scope of the invention.

We claim:

1. An apparatus for firing thyristors in a thyristor rectifier, the rectifier supplying an output current to an inductive load, said thyristors being gated by a firing angle signal, comprising:
    a thyristor rectifier, responsive to an alternating current supply signal for providing a direction signal and a firing angle signal and an output current;
    a discontinuity detector, responsive to said output current, for providing a discontinuity signal when said output current becomes zero;
    synchronization means for providing a synchronization signal, in response to said alternating current supply signal;
    firing enable means, responsive to said firing angle signal and said discontinuity signal, for providing a firing enable signal;
    channeling means, responsive to said firing angle signal, said synchronization signal, and said firing enable signal, for providing a channeling signal; and
    gate firing means, responsive to said direction signal and said channeling signal, for providing a gate current.

2. The apparatus of claim 1 wherein said inductive load is the generator field of a Ward-Leonard electric drive.

3. An apparatus for firing thyristors in a thyristor converter responsive to an A/C supply signal for providing a direction signal and a firing angle signal and for providing an output current to an inductive load, comprising:
    a discontinuity detector, responsive to said output current for providing a discontinuity signal when said output current becomes less than a selected magnitude and for causing a thyristor gate current to be provided a long as said output current is below said selected magnitude;
    firing enable means, responsive to said firing angle signal and said discontinuity signal, for providing a firing enable signal;
    synchronization means for providing a synchronization signal in response to said A/C supply signal; and
    thyristor firing means responsive to a direction signal, said firing angle signal and said synchronization signal for providing a gate current to one of said thyristors in said thyristor bridge, the duration of said gate current being a function of said discontinuity so that said gate current is shut off at the same time that the thyristor forward current is discontinuous.

4. The apparatus of claim 3 wherein said thyristor firing means includes:
    channeling means, responsive to said firing angle signal, said synchronization signal, and said firing enable signal for providing a channeling signal; and
    gate firing means, responsive to said direction signal and said channeling signal for providing a gate current.

5. The apparatus of claim 3 wherein said inductive load is the generator field of a Ward-Leonard electric drive.

* * * * *